United States Patent [19]
Liu et al.

[11] Patent Number: 5,705,428
[45] Date of Patent: Jan. 6, 1998

[54] METHOD FOR PREVENTING TITANIUM LIFTING DURING AND AFTER METAL ETCHING

[75] Inventors: Lianjun Liu, Singapore, Singapore; Chiu-Kwan Man, Austin, Tex.

[73] Assignee: Chartered Semiconductor Manufacturing Pte, Ltd., Singapore, Singapore

[21] Appl. No.: 511,063

[22] Filed: Aug. 3, 1995

[51] Int. Cl.$^6$ .................................. H01L 21/44
[52] U.S. Cl. .......................... 437/192; 156/651.1
[58] Field of Search ........................ 437/192, 194; 156/651.1, 646.1

[56] References Cited

U.S. PATENT DOCUMENTS

| | | | |
|---|---|---|---|
| 4,412,885 | 11/1983 | Wang et al. | 156/646.1 |
| 4,567,058 | 1/1986 | Koh | 437/195 |
| 4,654,120 | 3/1987 | Dougherty | 156/651.1 |
| 4,948,462 | 8/1990 | Rossen | 156/646.1 |
| 5,057,187 | 10/1991 | Shinagawa et al. | 156/651.1 |
| 5,310,456 | 5/1994 | Kadomura | 156/657 |
| 5,314,576 | 5/1994 | Kadomura | 156/655 |
| 5,397,432 | 3/1995 | Konno et al. | 156/646.1 |
| 5,407,862 | 4/1995 | Miyamoto | 437/192 |
| 5,412,250 | 5/1995 | Brugge | 437/192 |
| 5,430,328 | 7/1995 | Hsue | 437/192 |
| 5,449,639 | 9/1995 | Wei et al. | 437/192 |
| 5,522,520 | 6/1996 | Kawamoto | 156/643.1 |
| 5,527,736 | 6/1996 | Huang et al. | 437/195 |
| 5,545,289 | 8/1996 | Chen et al. | 156/643.1 |
| 5,561,084 | 10/1996 | Takata | 437/192 |

FOREIGN PATENT DOCUMENTS 78-076937  7/1978  Japan.

*Primary Examiner*—John Niebling
*Assistant Examiner*—Kevin Turner
*Attorney, Agent, or Firm*—George O. Saile

[57] ABSTRACT

A process for forming metal composites, using a titanium underlay as part of the composite, with reduced risk of titanium adhesion loss or lifting, has been developed. Several solutions, resulting in protective layers being formed on the exposed titanium sidewall, have been shown. One solution features the addition of nitrogen, as part of reactive ion etching chemistry, during the patterning of the underlying titanium layer. The resulting titanium nitride formation, on the exposed titanium sidewall, protects against subsequent processing steps that may degrade the adhesion of titanium to an underlying material. A second solution describes the formation of a titanium oxide film on the exposed titanium sidewall. This formation occurs during a photoresist plasma strip, using an oxygen-stream ambient. The titanium oxide film again results in protection of the titanium interface, during subsequent processing steps.

24 Claims, 3 Drawing Sheets

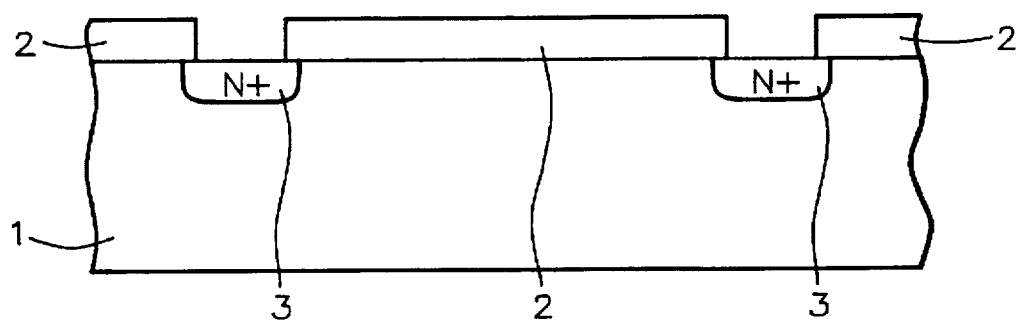
*FIG. 1*
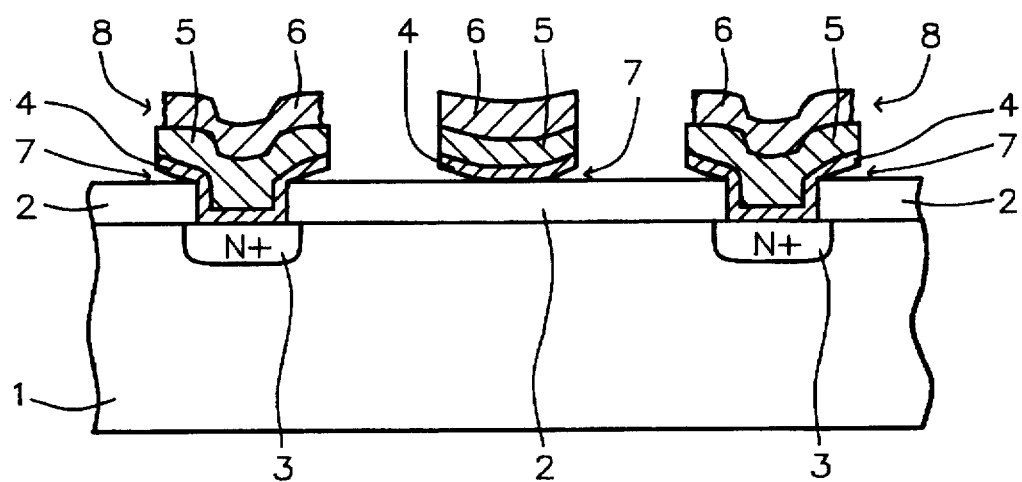
*FIG. 2 - Prior Art*

METHOD FOR PREVENTING TITANIUM LIFTING DURING AND AFTER METAL ETCHING

BACKGROUND OF THE INVENTION (1) Field of the Invention

The present invention relates to a fabrication technique for semiconductor integrated circuits, and more specifically to processes used to pattern metal lines.

(2) Description of Prior Art

The semiconductor industry is continually striving to increase the performance of integrated circuits while still maintaining or reducing the cost of these devices. The trend to sub-micron dimensions has allowed these objectives to be realized. Smaller device features have resulted in smaller chip size and therefore more chips per wafer. This in turn reduces the cost of the wafer. In addition the smaller device feature size can also result in performance enhancements. For example, metal oxide semiconductor field effect transistors, (MOSFET), exhibit enhanced performance as the channel length of the MOSFET decreases, which in turn is accomplished by decreasing the gate structure dimension. Aother example of performance enhancements is realized by reducing the distance between active elements on the chip, thus reducing delay times. This is accomplished by reducing the dimensions of of all chip features, including via hole, metal stud and metal interconnect width.

A major factor in reducing device dimensions has been the advances witnessed in the photolithograpic disciplines. More sophisticated cameras and more sensitive photoresist materials have contributed to the achievement of sub-micron device images. Rapid development of other semiconductor fabrication areas, such as reactive ion etching, (RIE), ion implantation, (I/I), and low pressure chemical vapor deposition, (LPCVD), have also played a major role in achieving sub-micron device images, and thus higher density integrated circuits. However the trend to smaller features has also presented specific vulnerabilities. For example, to reduce delay times, shorter distances between device elements are needed, thus narrower metal lines are used. One specific metallurgy practiced in the industry is a composite of aluminum-titanium/tungsten-titanium. The aluminum based layer is used primarily as the major conductive film of the composite. The titanium/tungsten layer is used to prevent penetration of aluminum into active silicon regions, when this composite is used as a contact metallurgy. Finally the titanium layer is used to reduce the interface resistance, of the composite structure to silicon, again when used as a contact metallury, or to provide adhesion to a field oxide region, when used as an interconnect.

A problem encountered with the aluminum-titanium/tungsten-titanium composite is the increased risk of titanium lifting during specific fabrication sequences, such as photoresist removal processes or simply water rinses. The sidewall attack of titanium specifically with very narrow metal line widths, can result in severe adhesion losses. The mechanism for the adverse titanium reaction is believed to be, in the case of the resist removal process, evolution of chlorine, during oxygen ashing, resulting in sidewall corrosion, and subsequent lifting of the titanium layer. For the water rinse case the reaction of water and titanium result in a titanium hydroxide film formation, which in turn results in an adhesion loss, or lifting, from the underlying material. Therefore specific treatments are needed to protect the titanium sidewall, of the metal composite, during subsequent device processing. Kadomura, in U.S. Pat. No. 5,314,576, and U.S. Pat. No. 5,310,456 describes a process in which a protective layer of SNx is used. However this process is costly and not easily adaptable to all applications. This invention will describe several iterations of a protective layer, that will allow the use of composite metal structures, with titanium underlays, that is not costly, easy to implement, and compatable with most semiconductor fabrication processes.

SUMMARY OF THE INVENTION

It is an object of this invention to eliminate the lifting, or adhesion loss, of titanium from an underlying material during subsequent semiconductor processing steps.

It is another object of this invention to provide a layer to protect the sidewalls of titanium from subsequent semiconductor processing steps.

It is yet another object of this invention to form a protective layer of titanium oxide, or titanium nitride, on the sidewalls of titanium.

In accordance with the present invention, a method is described for fabricating a metallurgical composite layer, to be used for integrated device applications. The steps consist of depositing a composite or an underlying layer of titanium, a barrier layer of titanium-tungsten, and a top layer of an aluminum based material, on a semiconductor substrate which has the desired patterning needed to form the required circuit design. Standard photolithographic processing is used to form the desired pattern in the photoresist. The desired pattern is transferred to the metal composite via reactive ion etching. Reactants, containing nitrogen, can be chosen, to etch specific layers of the composite, that form a protective titanium nitride film on the exposed underlying titanium sidewalls. Removal of the photoresist layer can be performed in an oxygen-steam ambient, that will also form a protective titanium oxide film on the exposed titanium sidewalls, if the sidewalls were not first prepared to form the titanium nitride sidewall.

BRIEF DESCRIPTION OF THE DRAWINGS

The objects and other advantages of this invention are best explained in the preferred embodiments with reference to the attached drawing that include:

FIG. 1, schematically representing a cross-sectional view of a semiconductor device, prior to metallization.

FIG. 2, schematically showing a cross-sectional representation of prior art, in which lifting of the titanium underlay has occured.

DESCRIPTION OF THE PREFERRED EMBODIMENTS

The method for preventing titanimum lifting, or titanium adhesion loss, when used as part of a composite metallurgy in the fabrication of semiconductor devices, is now described in detail.

FIG. 1, briefly illustrates the key stages and steps used in the fabrication sequence of a semiconductor device, up to the point where the contact metallization is to occur. In FIG. 1, semiconductor substrate, 1, for this case consisting of P type silicon, with a <100> crystallographic orientation, is used. A silicon dioxide layer is patterned to form islands, 2, to be used as a diffusion mask in order to create active device regions, 3, shown as N type areas in FIG. 1.

FIG. 2, illustrates prior art, in which a metallization pattern is constructed to contact the active regions, 3, and traverse the silicon oxide layer, 2, of substrate, 1. A metallization consisting of a composite of titanium, 4, a titanium-tungsten alloy, 5, and a aluminum based layer, 6, is deposited, and patterned, using standard photolithography and reactive ion etching, and completed by removal of the pattening photoresist. During this process, several steps occur that are deleterious to the titanium-silicon dioxide interface, creating the loss of adhesion, or lifting, illustrated by area, 7, in FIG. 2. For example the removal of photoresist, via an oxygen plasma or wet techniques, can result in the evolution of chlorine. The effect of the chlorine can be evidenced as an attack of the titanium at the silicon dioxide interface shown as area 7, in FIG. 2, or an corrosion reaction with the aluminum layer, 6, shown as area 8, in FIG. 2.

Figure 3:
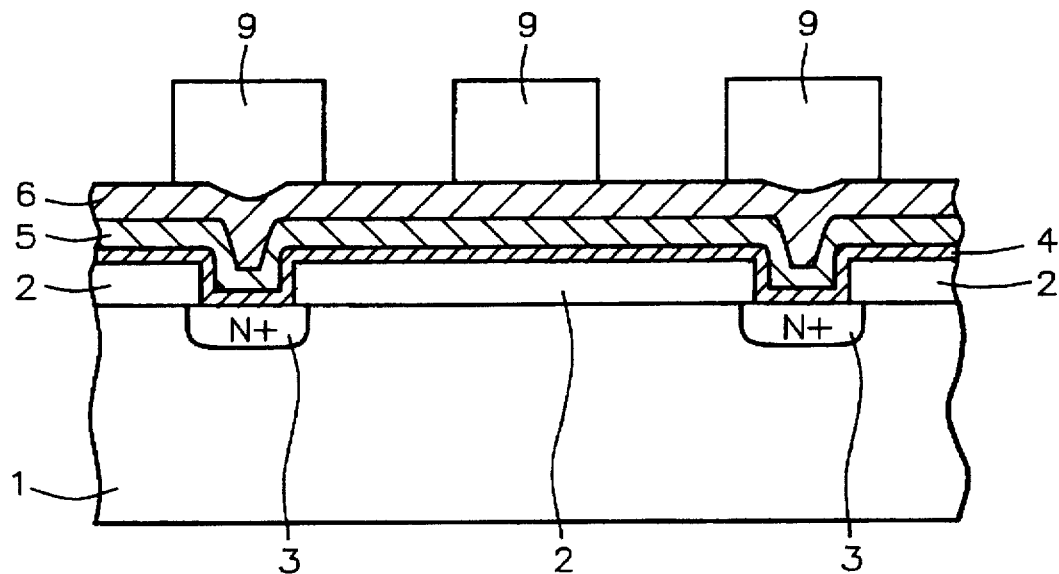
FIGS. 3–4, schematically showing a cross-sectional representation of a process solution to the titanium lifting phenomena, via the use of a nitride protective layer.
Figure 4:
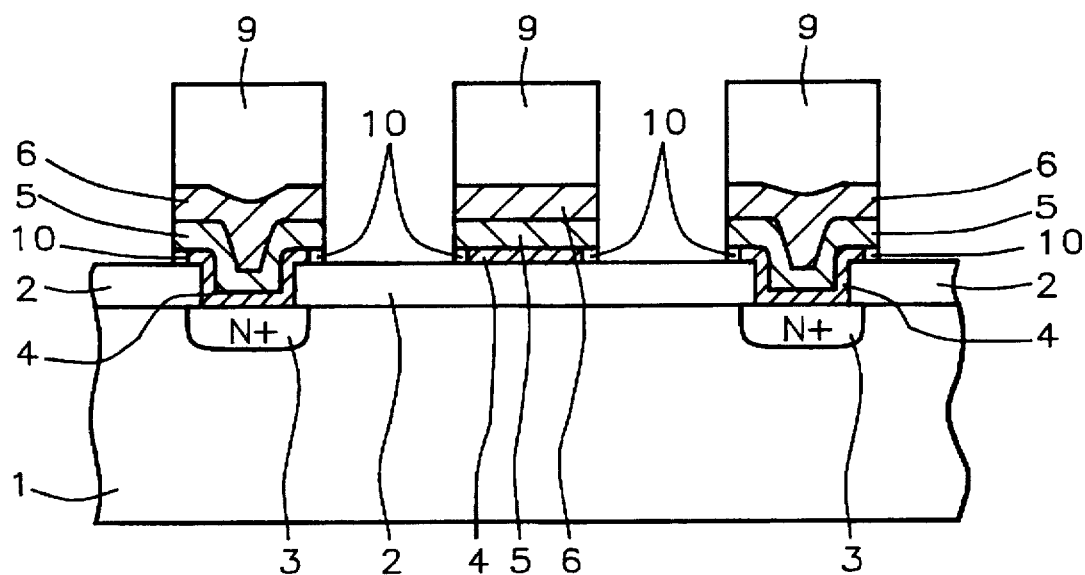

FIGS. 3–4, show a solution to the titanium lifting phenomena. In FIG. 3, a layer of titanium, 4, is deposited using r.f. sputtering, or conventional evaporation techniques, to a thickness between about 200 to 2000 Angstroms. This layer provides an adhesion film for the subsequent metal composite to the underlying silicon dioxide layer, as well as a film needed to reduce the interface resistance between the active device regions, 3, and the subsequent metal composite. Next the deposition of a titanium-tungsten layer, 5, is performed using r.f. sputtering, or conventional evaporation techniques. This layer consists of between about 8 to 12% titanium, and between about 88 to 92% tungsten. The thickness of this layer is between about 0 to 3000 Angstroms, and is used as a barrier to prevent penetration of aluminum to the active device regions, 3. Finally an aluminum based layer, 6, is deposited using between about 0 to 2% copper, to a thickness between about 4000 to 10000 Angstroms, using r.f. sputtering. Standard photolithographic procedures are then performed to create the desired patterns, 9, in the photoresist.

The above photoresist patterns are then used as a mask to enable the transfer of the desired image to the underlying metal composite. First reactive ion etching of the aluminum layer is performed using $BCl_3$, $Cl_2$, and $N_2$. Next the reactive ion etching of the titanium-tungsten layer occurs using $SF_6$ or a $CF_4$, $BI_3$ and $Cl_2$ mixture. Finally the patterning of the titanium layer takes place in an reactive ion etching ambient of between about 10 to 80 sccm of SF6, and between about 6 to 80 sccm of N2, and at a temperature between about 45° to 70° C. The addition of the N2 results in the creation of a titanium nitride sidewall film, 10. The titanium nitride film will protect the titanium layer 4, from being subjected to subsequent process situation, such as photoresist removal and subsequent chlorine evolution and attack, as well as deleterious water rinses, and avoiding the adhesion loss or lifting, previously observed in the prior art. The result of this reactive ion etching sequence is depicted in FIG. 4.

Figure 5:
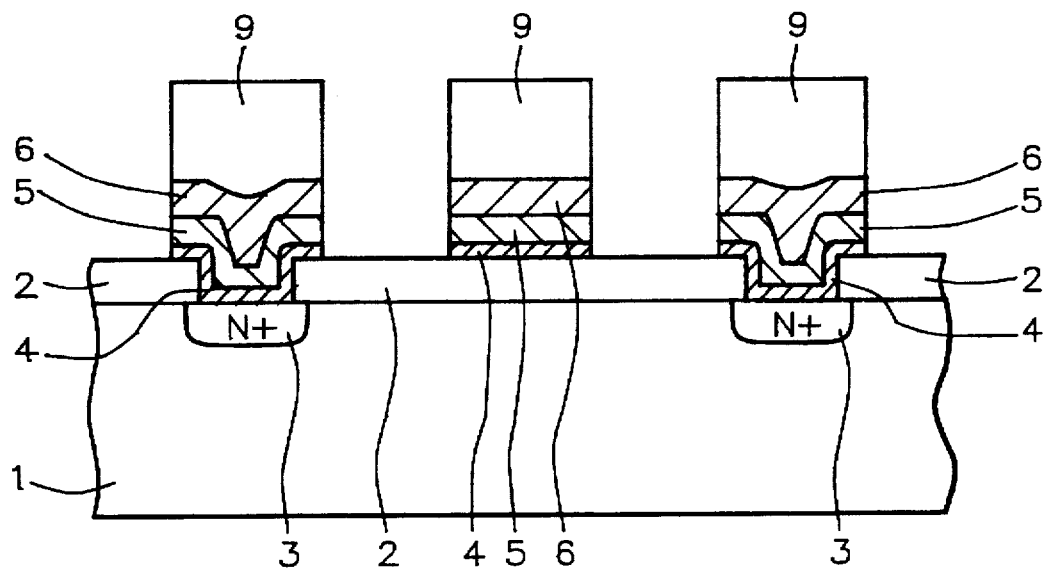
FIG. 5–6, schematically showing a process sequence that results in a solution of the titanium lifting phenomena, via the use of an oxide protective layer
Figure 6:
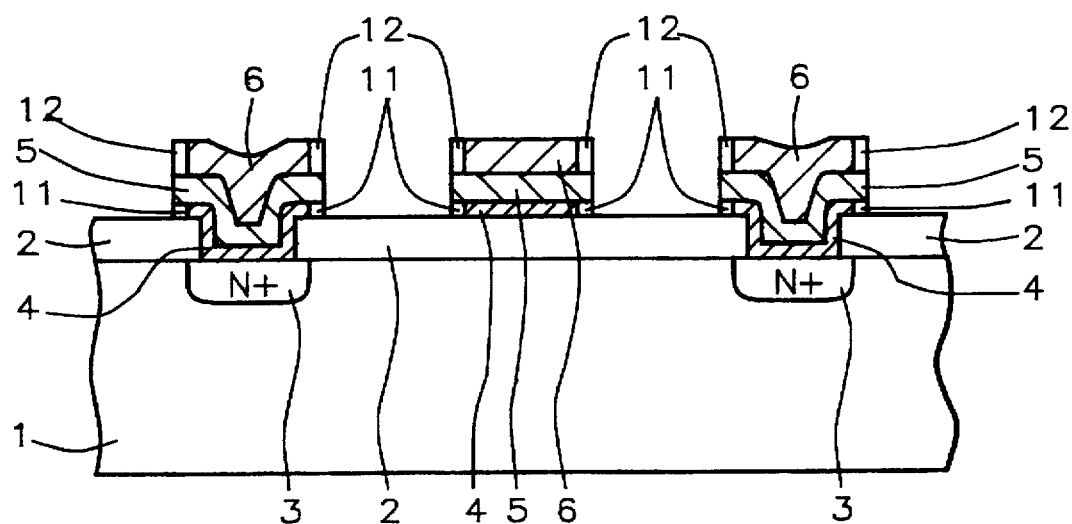

FIGS. 5–6, show a second solution to the titanium lifting phenomena. FIG. 5 again shows the metal composite on the semiconductor conductor substrate, again patterned with photoresist, and again subjected to a reactive ion etch procedure to transfer the desired image in the photoresist, 9, to the underlying metal composite. However in this case the titanium was reactively ion etched in $SF_6$, without the use of the N2 addition, thus leaving the titanium sidewalls unprotected. However the stripping of photoresist now is being performed in a mixture of $H_2O$ and $O_2$, consisting of between about 500 to 4000 sccm of $H_2O$, in a 20 to 100% oxygen ambient. This mixture reduces the effect of chlorine evolution, and the deleterious effect it has on the unprotected titanium, as well as on the unprotected aluminum sidewalls. This ambient also creates a titanium oxide sidewall film, 11, as well as an aluminum oxide sidewall film, 12, which offers protection in the form of titanium lifting or aluminum corrosion, resulting from subsequent process steps. This structure is shown schematically in FIG. 6.

A third solution to the titanium lifting and aluminum corrosion phenomena can be a combination of the previous two solutions. That is the etching of the titanium in a N2 ambient to create a titanium nitride sidewall, and photoresist removal in a $O_2$-$H_2O$ ambient to prevent aluminum degradation.

It should be noted that this invention that describes a method for preventing adhesion loss of titanium, during the metal etching procedure, although not shown as part of any specific device application can be used for the fabrication of NFET, (n type field effect transistors), PFET, (p type field effect transistors), as well as for CMOS, (complimentary metal oxide silicon), and BiCMOS (bipolar-CMOS), type devices.

While this invention has been particularly shown and described with reference to the preferred embodiments thereof, it will be understood by those skilled in the art that various changes in form and details may be made without departing from the spirit and scope of this invention.

What is claimed is:

1. A method for forming metal patterns on a semiconductor substrate comprising the steps of:

depositing a titanium layer on said semiconductor substrate;

depositing a layer of titanium-tungsten on said titanium layer;

depositing a layer of an aluminum based layer on said titanium-tungsten layer;

forming a photoresist image on said aluminum based layer;

anisotropically etching the exposed part of said aluminum based layer;

anisotropically etching the exposed part of said titanium-tungsten layer;

anisotropically etching the exposed part of said titanium layer using a reaction ambient, containing between about 5 to 80 sccm of $N_2$, as one of the reactants, at a temperature between about 45° to 70° C.

forming a titanium nitride film, between about 10 to 100 Angstroms in thickness, on the exposed sides of said titanium layer, during the anisotropic etching of said titanium layer; and removal of said photoresist image.

2. The method of claim 1, wherein said titanium layer is between about 200 to 2000 Angstroms.

3. The method of claim 1, wherein said titanium-tungsten layer is composed of between about 8 to 12% titanium, and between about 88 to 92% tungsten, deposited to a thickness between about 0 to 3000 Angstroms.

4. The method of claim 1, wherein said aluminum based layer is 100% aluminum, deposited to a thickness between about 4000 to 10000 Angstroms.

5. The method of claim 1, wherein said aluminum based layer contains between about 0 to 2% copper, by weight, and is deposited to a thickness between about 4000 to 10000 Angstroms.

6. The method of claim 1, wherein said anisotropic etching of the said aluminum based layer occurs in a mixture of between about 20 to 100 sccm of $BCl_3$, and between about 20 to 80 sccm of $Cl_2$.

7. The method of claim 1, wherein said anisotropic etching of said titanium-tungsten layer occurs in between about 10 to 80 sccm of $SF_6$.

8. The method of claim 1, wherein said anisotropic etching of titanium layer occurs in an ambient comprised of between about 10 to 80 sccm of $SF_6$, and between about 5 to 80 sccm of $N_2$, at a temperature between about 45° to 70° C.

9. The method of claim 1, wherein said titanium nitride film, formed on the exposed sides of said titanium layer, is between about 10 to 100 Angstroms in thickness, formed during the etching of between about 200 to 2000 Angstroms of said titanium layer.

10. The method of claim 1, wherein said photoresist is removed via plasma ashing in 100% oxygen, at a temperature between about 100° to 300° C.

11. A method for forming metal patterns on a semiconductor substrate, comprising the steps of:

depositing a titanium layer on said semiconductor substrate;

depositing a titanium-tungsten layer on said titanium layer;

depositing an aluminum based layer on said titanium-tungsten layer;

forming a photoresist shape on said aluminum based layer;

anisotropically etching the exposed part of said aluminum based layer;

anisotropically etching the exposed part of said titanium-tungsten layer;

anisotropically etching the exposed part of said titanium layer;

removal of said photoresist shape, in a plasma comprised of between about 500 to 4000 sccm of $H_2O$, and between about 20 to 100% $O_2$; and formation of a titanium oxide film, between about 10 to 100 Angstroms in thickness, on the exposed sides of said titanium layer, formed during said photoresist shape removal process.

12. The method of claim 11, wherein said titanium layer is between about 200 to 2000 Angstroms.

13. The method of claim 11, wherein said titanium-tungsten layer is between about 0 to 3000 Angstroms.

14. The method of claim 11, wherein said aluminum based layer is 100% aluminum, and deposited to a thickness between about 4000 to 10000 Angstroms.

15. The method of claim 11, wherein said aluminum based layer contains between about 0 to 2% copper, by weight and is deposited to a thickness between about 4000 to 10000 Angstroms.

16. The method of claim 11, wherein said anisotropic etching of said aluminum based layer occurs in a mixture between about 20 to 100 sccm of $BCl_3$, and between about 20 to 80 sccm of $Cl_2$.

17. The method of claim 11, wherein said anisotropic etching of said titanium-tungsten layer occurs in between about 10 to 80 sccm of $SF_6$.

18. The method of claim 11, wherein said anisotropic etching of said titanium layer occurs in between about 10 to 80 sccm of $SF_6$.

19. The method of claim 11, wherein said photoresist is removed in a plasma, containing between about 500 to 4000 sccm of $H_2O$, and between about 20 to 100% of $O_2$, at a temperature between about 100° to 300° C.

20. The method of claim 11, wherein said titanium oxide film, is formed to a thickness between about 10 to 100 Angstroms, on the exposed sides of said titanium layer, during the removal of said photoresist shape.

21. A method for forming metal patterns on a semiconductor substrate, comprising the steps of:

depositing a titanium layer on said semiconductor substrate;

depositing a titanium-tungsten layer on said titanium layer;

depositing an aluminum based layer on said titanium-tungsten layer;

forming a photoresist shape on said aluminum based layer;

anisotropically etching exposed part of said aluminum based layer;

anisotropically etching exposed part of said titanium-tungsten layer;

anisotropically etching exposed part of said titanium layer, in an ambient containing between about 5 to 80 sccm of $N_2$ as one of the reactants, using N2 as one of the reactants;

forming a titanium nitride layer, between about 10 to 100 Angstroms in thickness, on the exposed sides of said titanium layer, during the anisotropic etching of said titanium layer; and removal of said photoresist shape in an oxygen-steam plasma, forming an aluminum oxide film, on the exposed sides of said aluminum based layer.

22. The method of claim 21, wherein said anisotropic etching of said titanium layer occurs in between about 10 to 80 sccm of $SF_6$, and between about 5 to 80 sccm of $N_2$.

23. The method of claim 21, wherein said titanium nitride film, formed on exposed sides of said titanium layer to a thickness between about 10 to 100 Angstroms, and formed during the anisotropic etching of between about 200 to 2000 Angstroms of said titanium layer.

24. The method of claim 21, wherein said photoresist is removed in a plasma containing between about 500 to 4000 sccm of $H_2O$, and between about 20 to 100% oxygen.

* * * * *